United States Patent
Wang et al.

(10) Patent No.: US 8,410,503 B2
(45) Date of Patent: Apr. 2, 2013

(54) LIGHT EMITTING DEVICES

(75) Inventors: Jih-Fu Wang, Changhua County (TW); Chia-Hsin Chao, Taichung County (TW); Chen-Yang Huang, Hsinchu County (TW); Han-Tsung Hsueh, Taipei (TW); Chun-Feng Lai, Taichung County (TW); Wen-Yung Yeh, Hsinchu County (TW); Chien-Jen Sun, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/953,323

(22) Filed: Nov. 23, 2010

(65) Prior Publication Data

US 2011/0062414 A1 Mar. 17, 2011

Related U.S. Application Data

(62) Division of application No. 12/402,466, filed on Mar. 11, 2009, now abandoned.

(30) Foreign Application Priority Data

Dec. 1, 2008 (TW) ................................ 97146584 A

(51) Int. Cl.
*H01L 33/00* (2010.01)
*H01L 27/15* (2006.01)
(52) U.S. Cl. ................. 257/98; 257/79; 257/13; 257/89; 257/E33.001; 257/E33.055

(58) Field of Classification Search ............... 257/13, 257/14, 79, 98, E51.018, E51.021, E33.01, 257/E33.055, 40, 81, 88, 89
See application file for complete search history.

(56) References Cited

U.S. PATENT DOCUMENTS

| | | | | |
|---|---|---|---|---|
| 5,077,752 A | * | 12/1991 | Tada et al. | 372/96 |
| 6,914,269 B2 | * | 7/2005 | Nakamura | 257/103 |
| 8,049,233 B2 | * | 11/2011 | Fukshima et al. | 257/98 |
| 2001/0038102 A1 | * | 11/2001 | Kawase | 257/98 |
| 2003/0209714 A1 | | 11/2003 | Taskar et al. | |
| 2005/0236982 A1 | * | 10/2005 | Nakayama et al. | 313/506 |
| 2006/0043400 A1 | * | 3/2006 | Erchak et al. | 257/98 |
| 2007/0096127 A1 | * | 5/2007 | Pattison et al. | 257/98 |
| 2007/0284567 A1 | * | 12/2007 | Pokrovskiy et al. | 257/13 |
| 2008/0290794 A1 | * | 11/2008 | Yuasa | 313/504 |

OTHER PUBLICATIONS

China Patent Office, Office Action, Patent Application Serial No. 200810185203.7, Jan. 30, 2011, China.
China Patent Office, Office Action, Application Serial No. 200810185203.7, Apr. 1, 2012, China.

* cited by examiner

*Primary Examiner* — Colleen Matthews
*Assistant Examiner* — Galina Yushina

(57) ABSTRACT

A new light emitting device is disclosed, including a polarizing surface layer, a light emitting layer which emits light at a wavelength, and a light transformation layer disposed between the light emitting layer and the reflective layer, wherein the light emitting layer is disposed between the reflective layer and the polarizing surface layer, and an optical thickness between the light emitting layer and the reflective layer is less than a value of five times of a quarter of the wavelength.

16 Claims, 17 Drawing Sheets

LIGHT EMITTING DEVICES

CROSS REFERENCE TO RELATED APPLICATIONS

This application is a Divisional application of pending U.S. patent application Ser. No. 12/402,466, filed Mar. 11, 2009 and entitled "LIGHT EMITTING DEVICES". This application is based upon and claims the benefit of priority from a prior Taiwanese Patent Application No. 097146584, filed on Dec. 1, 2008, the entire contents of which are incorporated herein by reference.

BACKGROUND OF THE INVENTION

1. Field of the Invention

The invention relates to display devices, and in particular to light emitting devices capable of emitting collimated and polarized lights.

2. Description of the Related Art

Light emitting devices, such as display devices, have been extensively applied in business, entertainment, military, medical, engineering, and civil regimes. With the application of display devices gradually expanding and being more popular, the development trends of the display devices are intended to become lighter, thinner, and more compact for the purpose of lower power consumption and more environmental friendliness to human beings.

Generally speaking, all of the display devices require light sources. For example, conventional projector adapts high efficient high-pressure mercury lamps (UHE) or (UHP) as light sources. Light emission of UHE or UHP, however, preferably has to be a collimated light beam, which is regulated by optical systems for the projector application. In reality, most of emitted light angles of the abovementioned lamps exceed 10 degrees, the light at these emission angles cannot be collimated completely resulting in waste of light energy. In addition, he UHE and UHP, moreover, also emits infrared light, which also can not be used in projector application and most of these infrared is transformed into heat, scattered light, and thermal noise. Therefore the more widely spread application of the projector is limited. Furthermore, for the flat panel display (FPD), lots of polarizer films and filters are required to implement in these devices. The multiple light absorption and reflection of these optical components also results in inefficient consumption of light energy for the flat panel display application.

Accordingly, light emitting devices capable of emitting collimated and polarized lights to reduce optical components are indispensable in the industry to overcome the abovementioned problems.

BRIEF SUMMARY OF THE INVENTION

According to techniques of the invention, light emitting devices capable of emitting collimated and polarized lights are presented.

According to techniques of the invention, an embodiment of the light emitting device comprises: a surface layer; a light emitting layer which the emitted light has a wavelength; and a reflective layer, wherein the light emitting layer is disposed between the reflective layer and the surface layer, and an optical thickness between the light emitting layer and the reflective layer is about a value of integer times of a quarter of the wavelength.

According to techniques of the invention, another embodiment of the light emitting device comprises: a surface layer; a light emitting layer which the emitted light has a wavelength; a reflective layer; and a light transformation layer, wherein the light emitting layer is disposed between the reflective layer and the surface layer, and an optical thickness between the light emitting layer and the reflective layer is about a value of integer times of a quarter of the wavelength, wherein the light transformation layer is adjacent to the light emitting layer.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
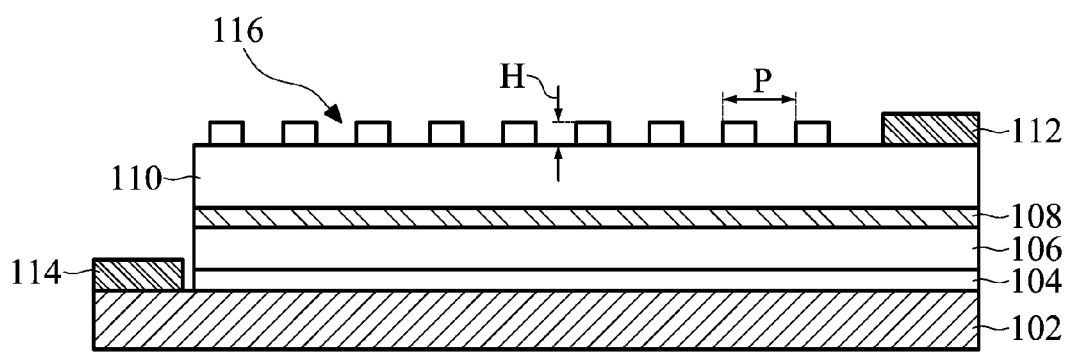
FIG. 1A is a schematic diagram illustrating light emitting devices 100a and 100b according to the first or the second embodiment of the invention.

It is understood that the following disclosure provides many different embodiments, or examples, for implementing different features of various embodiments. Specific examples of components and arrangements are described below to simplify the present disclosure. These are merely examples and are not intended to be limited. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

Accordingly, an embodiment of a light emitting device of the invention is disclosed. The light emitting device includes a plurality of layers of stacked structures. The stack structures include a reflective layer; a light emitting layer which emitted light has a wavelength; and a surface layer, wherein the light emitting layer is interposed between the reflective layer and the surface layer, and an optical thickness or on optical path between the light emitting layer and the reflective layer is about a value of m times of a quarter of the wavelength ($\lambda$), and the optical thickness is in a range which approximately satisfies nD=m×$\lambda$/4. The optical thickness can alternatively satisfy (m−1)×$\lambda$/4<nD<(m+1)×$\lambda$/4, and can tolerate ±15% variations. The light emitted by the device can be not only collimated but also polarized. The optical thickness equals to the real thickness between the light emitting layer and the reflective layer multiply refractive index of each corresponding layer. Parameters can be indicated as (nD=$n_1$×$d_1$+$n_2$×$D_2$...$n_m$×$d_m$) and (D=$d_1$+$d_2$+...+$d_m$), where nD is depicted as the optical thickness, D is real total thickness, n imeans refractive index, $n_1$ is refractive index of the $i^{th}$ layer material, $d_1$ is the thickness of the $i^{th}$ layer material, i=1, 2, ... m, where m is a positive integer, and 1≦m≦12.

According to another embodiment of the invention, the light emitting device includes a plurality of layers of stacked structures. The stack structures include a reflective layer; a light transformation layer; a light emitting layer which emitted light has a wavelength; and a surface layer, wherein the light transformation layer is interposed between the reflective layer and the light emitting layer, wherein the light emitting layer is interposed between the reflective layer and the surface layer, wherein an optical thickness exists between the light emitting layer and the reflective layer, wherein the optical thickness is about a value of m times of a quarter of the wavelength ($\lambda$), and the optical thickness is in a range which approximately satisfies nD=m$\lambda$/4. The optical thickness can alternatively satisfy (m−1)×$\lambda$/4<nD<(m+1)×$\lambda$/4, and can tolerate ±15% variations. The light transformation layer is an interface layer with a plurality of structures. These structures are distributed in patterned forms on an interface of the light transforming layer, and the dielectric function of the interface is a spatial function varied with the patterned forms such that the light emitted by the device can be not only collimated but also polarized.

In the following descriptions, an example of a light emitting diode (LED) is in conjunction as an implementation embodiment. However, it should be understood that in other embodiments other light emitting devices such as an organic light emitting diode (OLED), polymer light emitting diode (PLED), or semiconductor optic amplifier (SOA) etc., are also applicable thereto.

Figure 1B:
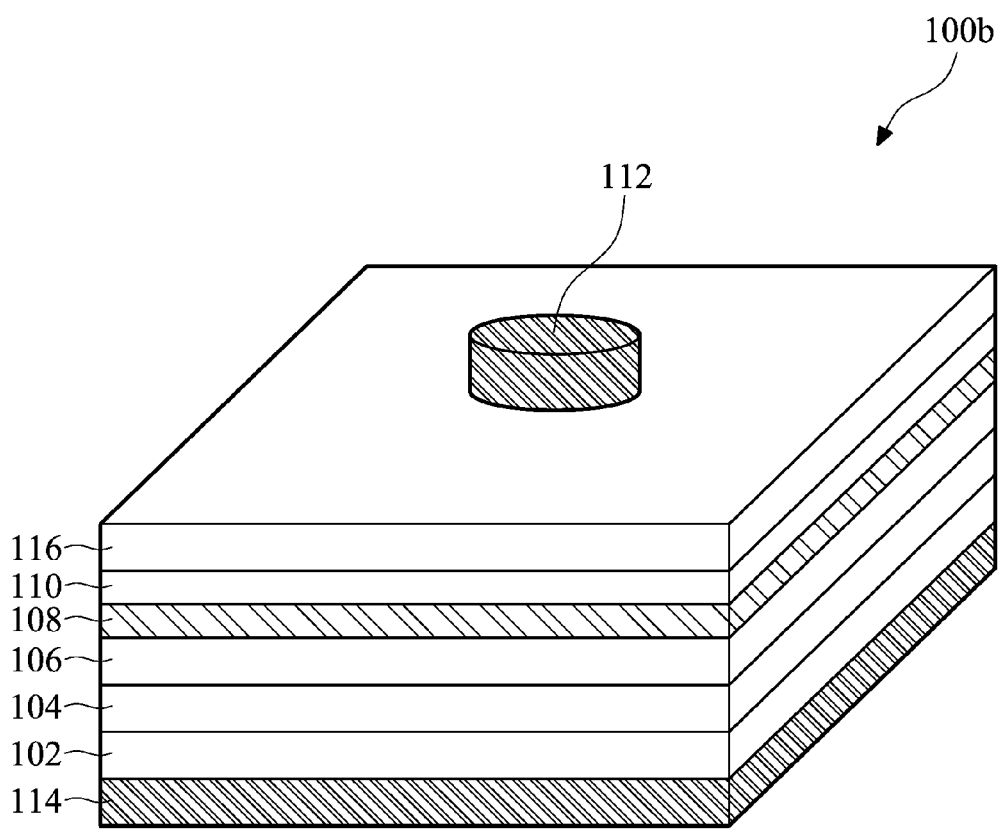
FIG. 1B is a schematic diagram illustrating a thin GaN LED structure 100b according to the first or the second embodiment of the invention.

As shown in FIGS. 1A and 1B, a schematic diagram of light emitting devices 100a and 100b such as light emitting diodes are respectively provided. The light emitting diodes can comprise a plurality of deposition layers of stacked structure which can be disposed overlying a substrate (not shown) such as a sapphire or silicon. The aforementioned deposition layers can include a reflective layer 102, a conductive layer 104, a first carrier conductive layer 106 such as a p-type carrier conductive layer, a light emitting layer 108, a second carrier conductive layer 110 such as an n-type carrier conductive layer, and a polarized layer 116 which is a thin film layer polarizing the transmission light. Furthermore, as shown in FIG. 1A, a conductive electrode 112 is disposed on the second carrier conductive layer 110 to serve as a contact pad on the n-type side, while another conductive electrode 114 is disposed on the reflective layer 112 to serve as a contact pad on the p-type side, wherein, in contrast with the conductive electrode 112 on the n-type side, the conductive electrode 114 on the p-type side is sustained with a positive voltage. In addition, in another embodiment, the first carrier conductive layer 106 can be an n-type carrier conductive layer, while the second carrier conductive layer 110 can be a p-type carrier conductive layer. Accordingly, in this embodiment, the conductive electrode 112 serves as a contact pad on the p-type side, while the conductive electrode 114 serves as a contact pad on the n-type side. In addition, according to embodiments of the light emitting device structure 100 and the thin LED structure 100b of the invention, the bottom conductive electrode 114 is not necessarily made up of Cu.

A plurality of layers of stacked structure in the light emitting device 100 include a reflective layer 102, a light emitting layer 108 and a surface layer, wherein the light emitting layer is interposed between the reflective layer and the surface layer, and an optical path exists between the light emitting layer and the reflective layer. Moreover, the equals to the real thickness between the light emitting layer and the reflective layer multiply refractive index of each corresponding layer.

The light emitting layer emits a light with a wavelength, wherein the optical thickness is about m times of a quarter of the wavelength, where m is a positive integer. The optical thickness can approximately satisfy nD=m$\lambda$/4, or satisfy (m−1)×$\lambda$/4<nD<(m+1)$\lambda$/4, and can tolerate ±15% variations such that the light emitted by the device can be not only collimated but also polarized.

In implementation, the surface layer can be a polarized layer 116, a surface layer with micro-structures, a near planar surface layer, or any combinations of the abovementioned material layers. Moreover, the optical path (thickness) between the surface layer and the reflective layer is equal to or less than 5 times or 20 times of the wavelength, wherein the emitted light finally leaves the surface layer of the device. Most of the lights emitted from the light emitting device are concentrated on directions perpendicular to the surface layer plane. Alternatively, most of the lights emitted from the light emitting device are concentrated on two lateral directions perpendicular to the surface layer plane if the optical thickness is properly chosen.

The reflective layer 102 includes a metal, a mixture of multiple metals, a metal alloy, a multi-layered dielectric mirror layer, or any combinations of the above-mentioned materials. Further, the reflective layer 102 can reflect the lights emitted from the light emitting layer 108 towards the reflective layer 102 which has at least 50% reflectance.

The conductive layer 104 can be a transparent conductive layer such as an indium tin oxide (ITO) layer. The conductive layer 104 can improve conductivity between the first carrier conductive layer 106 and the reflective layer 102. The conductive layer 104 is not necessarily made up of the indium tin oxide (ITO) layer, but can be transparent conductive materials which refractive indices (n) are less than that of the first carrier conductive layer 106. Additionally, in one embodiment, if a preferred conductivity is generated between the first carrier conductive layer 106 and the reflective layer, the conductive layer 104 can be optionally omitted during implementation.

In an embodiment of the light emitting diode based on gallium nitride (GaN), the first carrier conductive layer 106 can be a magnesium doped GaN deposition layer (p-doped), while the second carrier conductive layer 110 can be a silicon doped GaN deposition layer (n-doped). In this embodiment, the light emitting layer 108 can be InGaN/GaN quantum well deposition layers. The light emitting layer emits a light at a characteristic wavelength ($\lambda$) with bandwidth $\Delta\lambda$. The light emitting layer is preferably disposed a position departing from integral times of a quarter of the wavelength. That is, the thickness of the first carrier conductive layer 106 and the conductive layer 104 is preferably integral times of a quarter of the wavelength. In addition, a total optical thickness of the stack layers of the second carrier conductive 110 and the conductive layer 104 can be less than 5 times of the wavelength of the light emitting layer 108, wherein the emitted light finally leaves the surface layer. Most of the lights emitted from the light emitting device are concentrated on directions perpendicular to the surface layer plane. Alternatively, most of the lights emitted from the light emitting device are concentrated on two lateral directions perpendicular to the light surface layer plane if the optical thickness is properly chosen. In one embodiment, such as the light emitting diode based on gallium nitride (GaN), the thickness of the conductive layer 104 can be equal to or less than about 0.3 μm.

Furthermore, the light emitting layer includes a quantum well structure, a quantum dot, a fluorescent inorganic material, a phosphorescent inorganic material, a fluorescent organic material, a phosphorescent organic material, or any combinations of the aforementioned materials. The wavelength emitted from the light emitting layer is approximately in a range including a visible light, a UV light, an infrared light, or other wavelength range.

In FIG. 1A and FIG. 1B, the polarized layer 116 can be a plurality of parallel interval of metal layers which contains nano-wire gratings. The metal layers is periodically or non-periodically arranged on the surface of the second carrier conductive layer 110 capable of polarizing the lights from the light emitting layer 108. The light emitting diode 100 and 110b can thus generate polarized lights. In one embodiment, the thickness (H) of the metal layers of the light polarizing layer can be about 100 nm and each metal layer is periodically arranged with an interval about 120 nm. It should be understood that the thickness of the metal layers and the arrangement period of the metal layers are dependent on the wavelength of the light emitting layer. Therefore, the thickness and the arrangement period of the metal layers are not limited to embodiment of the invention.

Additionally, the light polarizing layer 116 in FIGS. 1A and 1B can be a structure with partial reflection, such as a multi-layered stack of dielectric layers, an extremely thin metal layer, a planar layer with multiple parallel arranged strips of metal layers, an organic light polarizing material layered, a light polarizing thin film with multiple dielectric stacked structures, or any combinations of the abovementioned materials. In one embodiment of the invention, the metal layers arranged with multiple intervals can also be periodically or non-periodically parallel interval arranged.

The stack layers of the light emitting diodes 100 (FIG. 1A) and 100b (FIG. 1B) can be formed by several different fabrication processes. For example, a deposition process, a laser process, lithography and etching processes are adapted to form each of the aforementioned deposition layers. However, for the embodiment of the light polarizing layer 116 with nano-metal grating structures, a metal layer can be first deposited, and nano-imprint lithography and etching processes can be subsequently implemented.

The materials of the light emitting device include a III-V group semiconductor material, an organic material, a polymer material, or any combinations of the aforementioned materials. The III-V group semiconductor material includes a nitrided base material, or an eptiaxial GaAs or InP base grown material. The nitrided base material includes a non-polar material or a semi-polar material. In another embodiment, the light emitting device further includes a surface layer plane which most of the emitted light with an included angle is equal to or less than 30 degrees to the normal lint of the surface layerplane. The normal line is perpendicular to the surface layer plane (indicated as angles between 90-60 degrees in FIG. 1E).

Figure 1C:
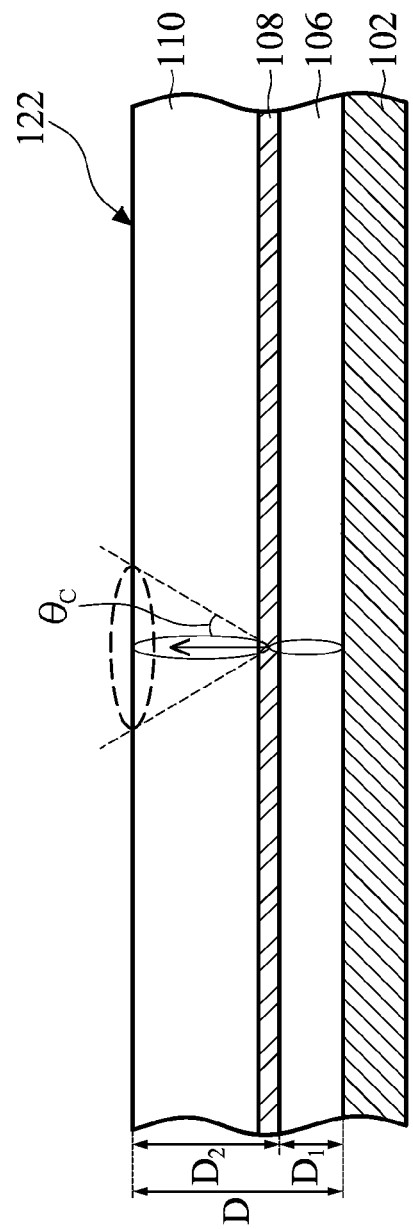
FIG. 1C and FIG. 1D are cross section views schematically illustrating the first embodiment of the light emitting device according to the invention.
Figure 1D:
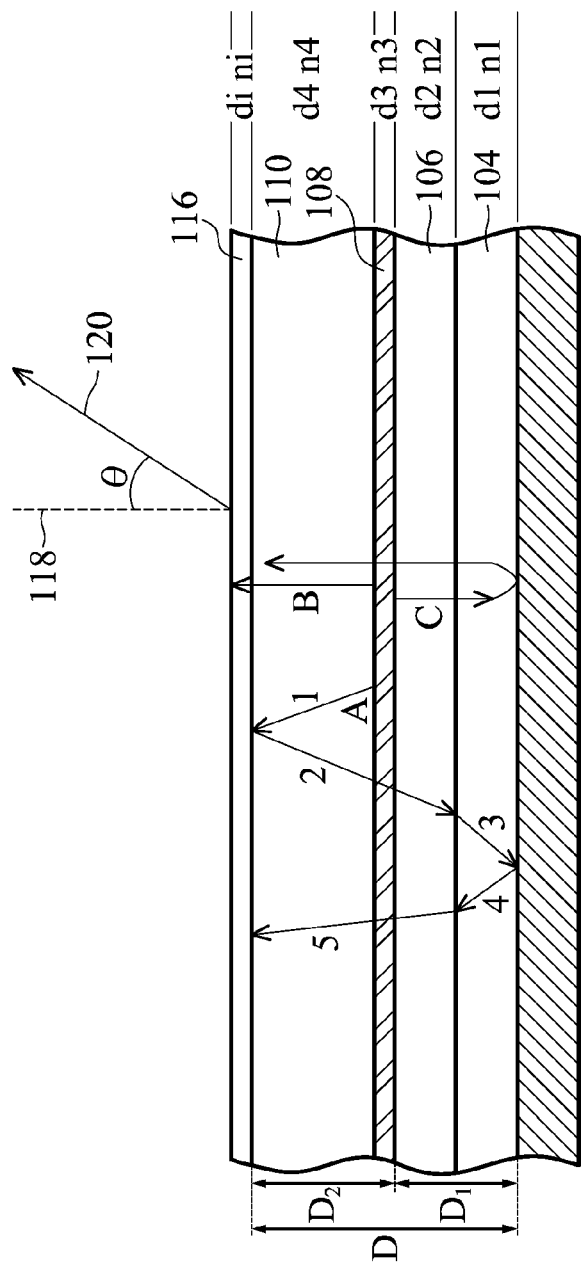
Figure 2:
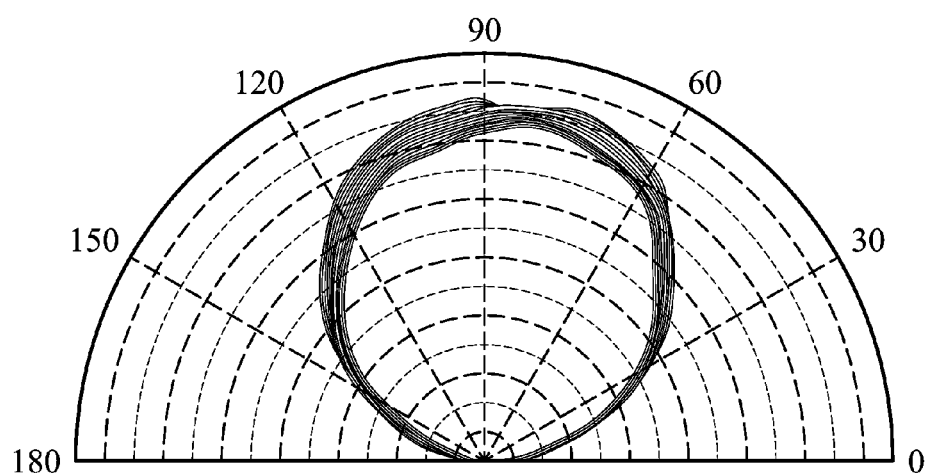
FIG. 2 shows a reference diagram of the lambertian light distribution according to an embodiment of the invention.

FIG. 1C and FIG. 1D are cross section views schematically illustrating a first embodiment of the light emitting device according to the invention. As shown in FIG. 1C and FIG. 1D, the light emitting layer is departed from the reflective layer 102 short enough such as a quarter or other integral times of the wavelength of the light emitting layer 108 with 15% tolerances such that the lobes of the radiation patterns of the light emission from the light emitting layer can be preferably determined. The lights which is emitted from the light emitting layer 108 towards the surface layer plane 122 has a preferable emission angle, thus further collimating light emitted form the light emitting layer 108. Besides, since the distance between the light emitting layer 108 and the reflective layer 102 is short enough, emitted light patterns and angles of the escape cones can thus be controlled such that the light emitting device can provide lights with a preferable collimated light distribution instead of a lambertian light distribution. The lambertian light distribution of the conventional LED is shown in FIG. 2. FIG. 1C and FIG. 1D are local cross sections of the light emitting device 100 (FIG. 1A) or the light emitting device 100b (FIG. 1B). In FIGS. 1C and 1D, the polarized layer 116 is depicted as a continuous deposition layer for simplicity. As shown in FIGS. 1C and 1D, the distance between the light emitting layer 108 and the reflective layer 102, i.e., the thickness of the first carrier conductive layer 106 (p-type carrier conductive layer) and the conductive layer 104 is depicted as thickness D1. The distance between the light polarizing layer 116 and the light emitting layer 108, i.e., the thickness of the second carrier conductive layer 110 and the light emitting layer 108 is depicted as thickness D2. The distance between the polarized layer 116 and the reflective layer 102, i.e., the thickness of the second carrier conductive layer 110 (n-type carrier conductive layer), the light emitting layer 108, the first carrier conductive layer 106, and the conductive layer 104 is depicted as total thickness D.

In one embodiment, the thickness D2 (micrometers) of the second carrier conductive layer 110 (such as n-type carrier conductive layer) and the light emitting layer 108 can be greater than or equal to 0.164 times of the mean value of refractive indices of the light polarizing layer 116, the second carrier conductive layer 110 and the light emitting layer 108 in FIG. 1A or FIG. 1B (i.e., $0.164 \times n_1$ μm, where $n_1$ is the mean value of refractive indices of the light polarizing layer, the second carrier conductive layer and the light emitting layer). However, the total thickness D from the second carrier conductive layer 110 to the conductive layer 104 can be less than or equal to 0.82 times of the mean value of refractive indices of the light polarizing layer 116, the second carrier conductive layer 110, the light emitting layer 108, the first carrier conductive layer 106, and the conductive layer 104 in FIG. 1A or FIG. 1B (i.e., $0.82 \times n$ μm, where n is the mean value of refractive indices of the light polarizing layer, the second carrier conductive layer, the light emitting layer, the first carrier conductive layer, and the conductive layer). In a specific embodiment, for example a gallium nitride based light emitting diode with an emission wavelength of 475 nm, the value of $n_1$ can be about 2.45, and D2 can be equal to or less than 0.4 μm. In the same embodiment, the value of $n_1$ can be about 2.45, and D can be equal to or less than 2 μm.

Furthermore as shown in FIG. 1C and FIG. 1D, when the light emitting layer 108 emits lights, the emitted light is towards the surface layer plane (the light polarizing layer 116), such as indicated as arrows A and B in FIG. 1D, and towards the reflective layer 102, such as indicated as arrow C in FIG. 1D. Since the polarized layer 116 in FIG. 1A or polarized layer 116 in FIG. 1b of the first embodiment of light emitting device of the invention are designed such that part of the emitted light is directly transmitted trough such as B, part of the emitted light is refracted such as A, and the light emitted from the light emitting layer 108 is polarized. The light refracted by the light polarizing layer 116 passes through the first carrier conductive layer 106 and the conductive layer 104 to the reflective layer 102, and then reflects by the reflective layer 102 and passes through the conductive layer 104, the first carrier conductive layer 106, the light emitting layer 108, the second carrier conductive layer 110 to the light polarizing layer 116 (as indicated in arrows 1-5 in FIG. 1D). The emission lights are cycling forwards and backwards between the light polarizing layer 116 and the reflective layer 102 until the directions of the emitted lights almost is toward a specific direction (i.e., falling within the cone $\theta_c$ of FIG. 1C), thereby passing through the light polarizing layer 116. On the contrary, the emitted lights towards the reflective layer 102, such as arrow C in FIGS. 1C and 1D, can be transmitted in the same manner until passing through the light polarizing layer 116.

In FIGS. 1C and 1D, since the emitted lights from the light emitting layer 108 has preferable collimated effects, an included angle $\theta$ (a light emission angle) between the light vector 120 of the surface layer plane on the light emitting device and the normal line 118 perpendicular to the surface layer plane is mostly equal to or less than a maximum emitted light angle $\theta_c$ (where $\theta_c \approx 30$ degrees relative to the GaN based LED 100 or 100b). The normal line is perpendicular to the surface layer plane.

Figure 1E:
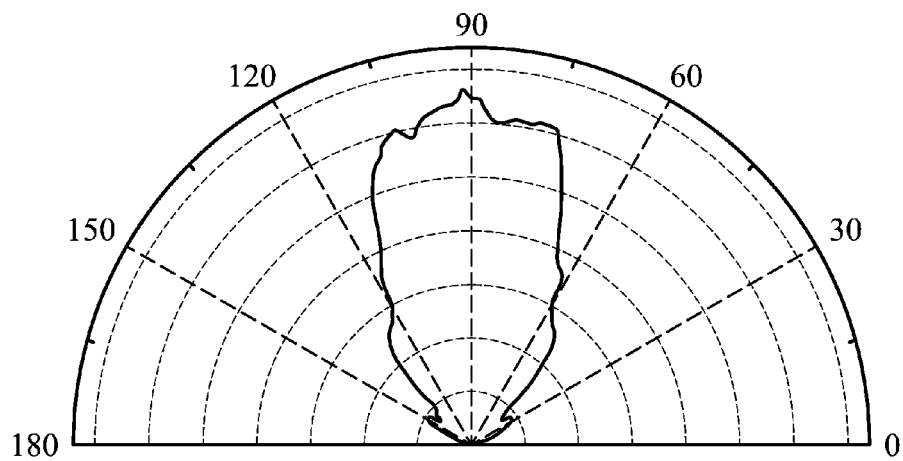
FIG. 1E and FIG. 1F respectively show simulated diagrams of luminance and P/S ratio of the light emitting device according to the first embodiment of the invention.
Figure 1F:
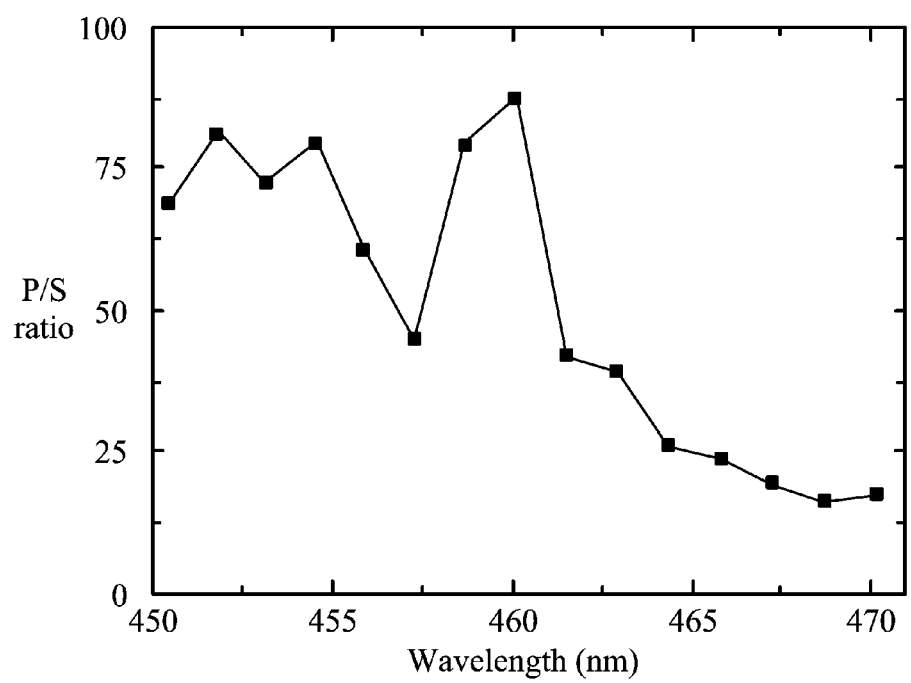

FIG. 1E and FIG. 1F respectively shows simulated diagrams of luminance and P/S ratio of the light emitting device 100 (FIG. 1A) or 100b (FIG. 1B) according to one embodiment (FIG. 1D) of the invention. As shown in FIG. 1E and FIG. 1F, in the radiation pattern diagram of the lights emitted from the light emitting device 100 or 100b of this embodiment, the emitted angles are converged within ±30 degrees. In FIGS. 1E and 1F, it is observed that when the light wavelength of the light emitting device 100 or 100b is about 460 nm, the P/S ratio can reach at least 75.

Since the emitted light from the light emitting layer 108 in the aforementioned embodiment is preferably collimated, an included angle $\theta$ (a emitted light angle) between the light vector 120 of the light emitting device and the normal line 118 perpendicular to the surface layer plane is mostly equal to or less than a maximum emitted light angle $\theta_c$ (where $\theta_c \approx 30$ degrees relative to the GaN based LED 100 or 100b), where the normal line is perpendicular to the light emission plane.

The $\theta$ value corresponding to FIGS. 1C, 1D and 1E can be between 10 degrees and 30 degrees, which is dependent from design parameters.

According to a second embodiment of the invention, the light emitting device further includes a first carrier conductive layer 106 interposed between the light emitting layer 108 and the reflective layer 102, and a second carrier conductive layer 110 interposed between the surface layer and the light emitting layer 108. A light transformation layer is interposed between the first carrier conductive layer 106 and reflective layer 102 (indicated as 105 in FIGS. 2A and 2B) or interposed between the second carrier conductive layer 110 and the surface layer (indicated as 109 in FIGS. 3A and 3B). The light transformation layer can be made of a transparent conductive material or a carrier conductive material. In one embodiment, the total thickness of the second carrier conductive layer and the light emitting layer is equal to or greater than 0.164 times of the mean value of refractive indices of the polarized layer 116, the second carrier conductive layer, and the light emitting layer. In another embodiment, the total thickness from the second carrier conductive layer to the conductive layer is equal to or greater than 0.82 times or 2 times of the mean value of refractive indices of the polarized layer, the second carrier conductive layer, the light emitting layer, the first carrier conductive layer, and the transparent conductive layer.

In the aforementioned second embodiment, the optical thickness between the light emitting layer and the reflective layer is about m times of a quarter of the wavelength, wherein m is a positive integer and is satisfied $1 \leq m \leq 40$.

In addition, in one embodiment, the aforementioned conductive layer 104 can be optionally adapted or omitted according to whether a preferable conductivity is existed between the first carrier conductive layer 106 and the reflective layer.

In another embodiment, the light transformation layer can be an interface layer with a plurality of structures, wherein the dielectric function of the interface is a spatial function of pattern distributions as shown in FIGS. 2C, 2D, 3C, and 3D. The plurality of structures includes an opening 124, a pillar, a pore 126, a stripe grating 128, or any combinations thereof. Further, the pattern distributions include a periodic repeating pattern, a non-periodic pattern, or any combinations thereof. Moreover, the periodic pattern includes a honeycomb, a non-equilateral parallelogram, an equilateral parallelogram, an annular, a 1D grating, a quasi photonic crystal, or any combinations thereof.

In implementation, the surface layer can be a light polarizing layer 116, a surface layer with micro-structures, a near planar surface layer, or any combinations of the abovementioned material layers. Moreover, the optical path (thickness) between the surface layer and the reflective layer is equal to or less than 5 times or 20 times of the wavelength, wherein the emitted light leaves the surface layer plane. Most of the light emitted from the light emitting device is concentrated on directions perpendicular to the surface layer plane. Alternatively, most of the light is emitted from the light emitting device are concentrated on two lateral directions perpendicular to the surface layer plane.

According to the structural embodiment of the light emitting device 100 or LED 100b, the first and the second carrier conductive layers 106 and 110 can correspond to a p-type and an n-type carrier conductive layers, but switching thereof can also be applicable. The bottom conductive electrode 114 can be not necessarily made up of Cu.

Figure 2A:
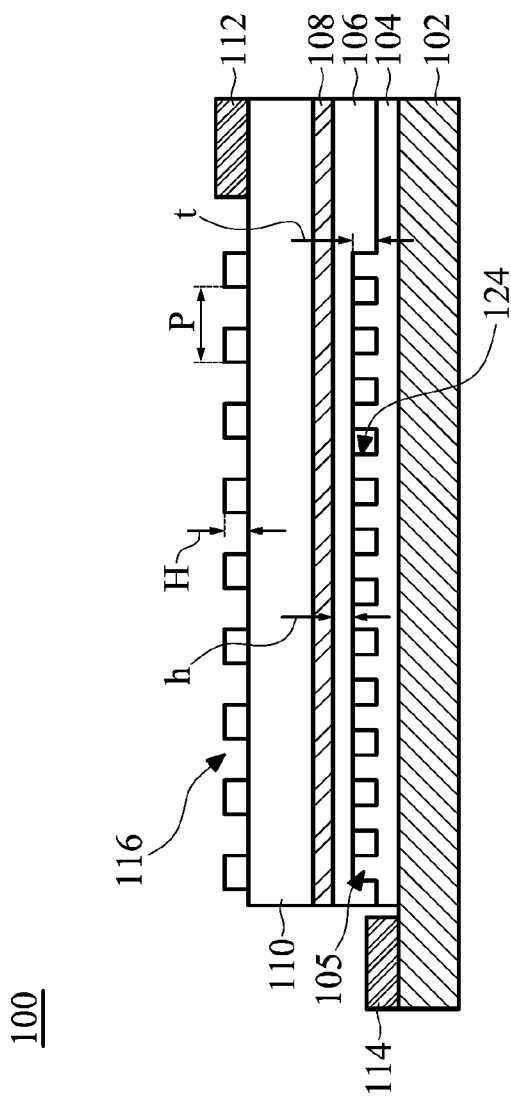
FIGS. 2A and 3A are cross section views of the light emitting device according to the second embodiment of the invention.
Figure 3A:
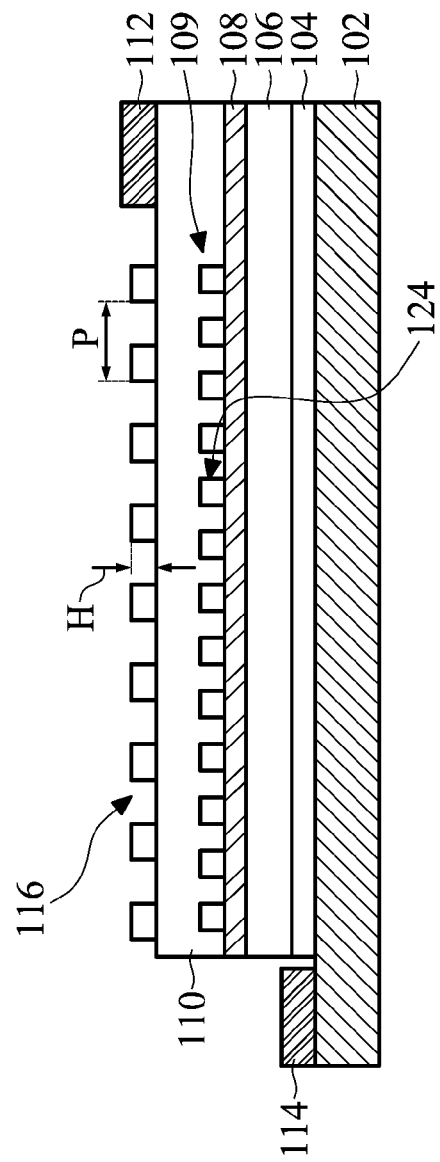

As shown in FIGS. 2A and 3A, a light emitting device structure 100 or 100b is provided which includes a stacked structure of multiple deposition layers. The stacked structure can include a reflective layer 102, a conductive layer 104, a first carrier conductive layer 106, a light emitting layer 108, a second carrier conductive layer 110, and a light polarizing layer 116. Compared with the aforementioned embodiments, several openings are formed on the surface of the conductive layer 104 in this embodiment. The dielectric function of the surface of the conductive layer 104 varies with the composed patterns of the openings which are disclosed in detail in the following description. Accordingly, in the second embodiment, similar elements are depicted as the same references. Fabrication methods and materials can also refer to the aforementioned embodiments, and for simplicity detail description is omitted.

In the light emitting device of the second embodiment, the light transformation is made of a transparent conductive material or a carrier conductive material.

In FIGS. 2A and 3A, the light emitting layer 108 is disposed away from the reflective layer 102 with a quarter of the emission wavelength or man integral times of a quarter of the emission wavelength. A tolerance of ±15% is acceptable. The optical thickness of the second carrier conductive layer 110, the light emitting layer 108, the first carrier conductive layer 106 and the conductive layer 104 (the light polarizing layer may also be included) is equal to or less than 20 times of the emission wavelength of the light emitting layer 108. As shown in FIGS. 1A and 1B of the first embodiment, the light emitting layer 108 is disposed away from the reflective layer with a short enough distance; therefore, emitted lights from the light emitting layer 108 is collimated.

Referring to FIG. 3A, in one embodiment, the light polarizing layer 116 can be metal layers with multiple parallel stripe intervals therebetween and the metal layers are periodically or non-periodically arranged on the surface of the second carrier conductive layer 110. In the second embodiment, the thickness and arrangement period of the metal layers of the polarized layer 116 are similar to those of the first embodiment. In addition, in the first embodiment, such as a GaN based LED, the thickness of the first carrier conductive layer 106 and the conductive layer 104 is preferably equal to or less than 0.3 μm. The depth of the openings on the surface of the conductive layer 104, such as pores 126 or trenches 128 can be about 0.2 μm. Moreover, the surface of the openings can be as close to the light emitting layer 108 as possible, as indicated h in FIGS. 2A and 3A, to enhance collimation effects.

Figure 2B:
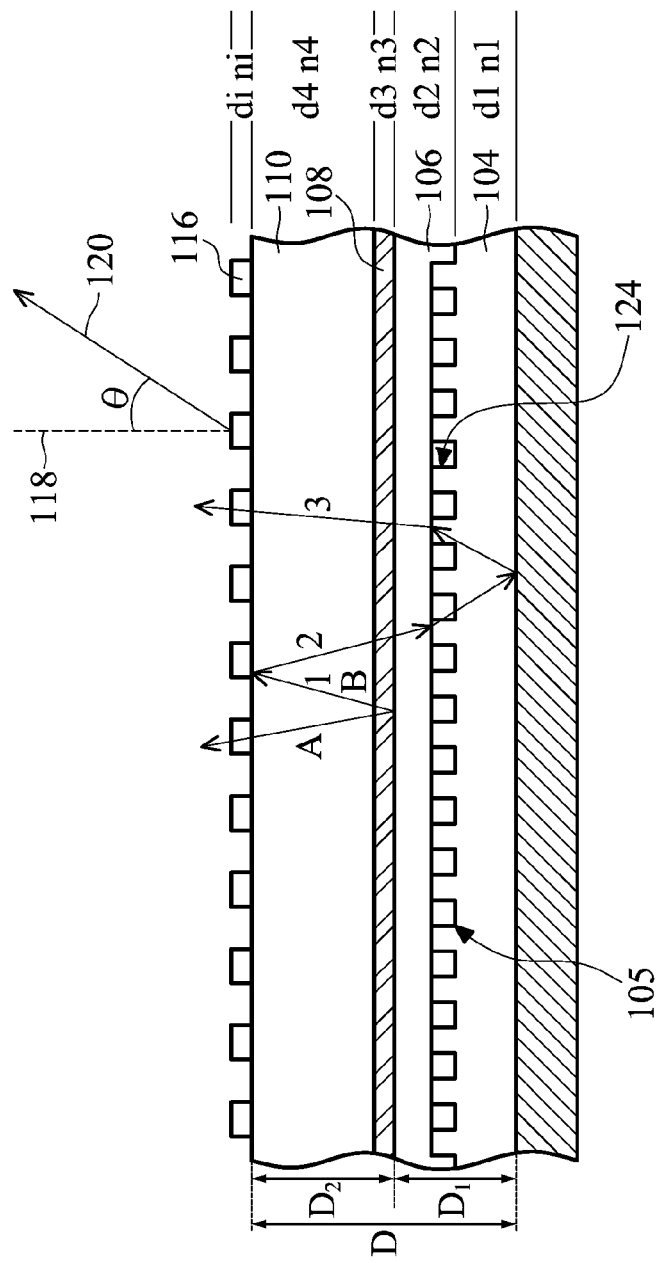
FIG. 2B and FIG. 3B are cross section views of the light emitting device 100 (FIG. 1A) or the light emitting device 100b (FIG. 1B)
Figure 2C:
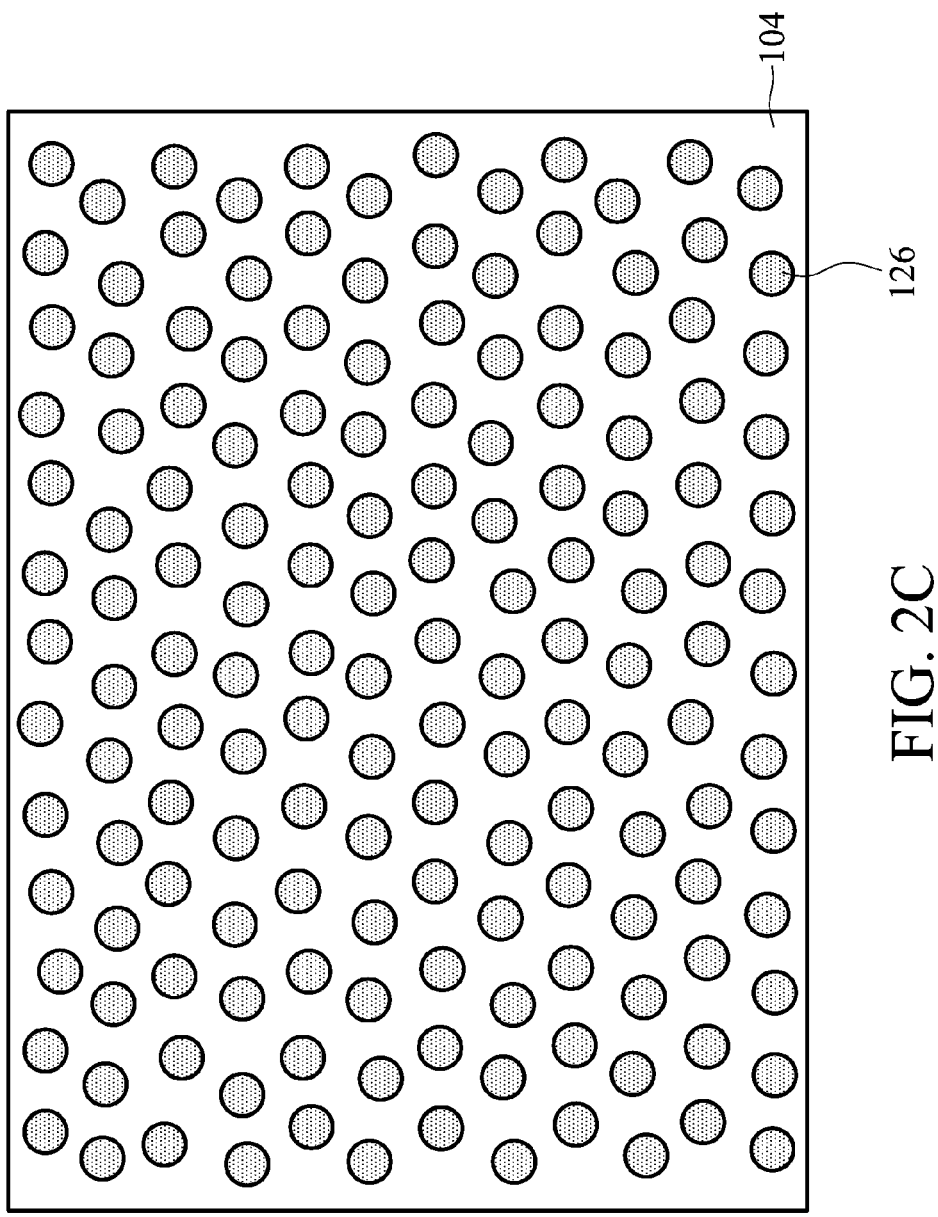
FIGS. 2C, 3C, 2D and 3D are schematic diagrams illustrating openings 124 on the surface of the conductive layer 104 in the light emitting device according to the second embodiment of the invention.
Figure 2D:
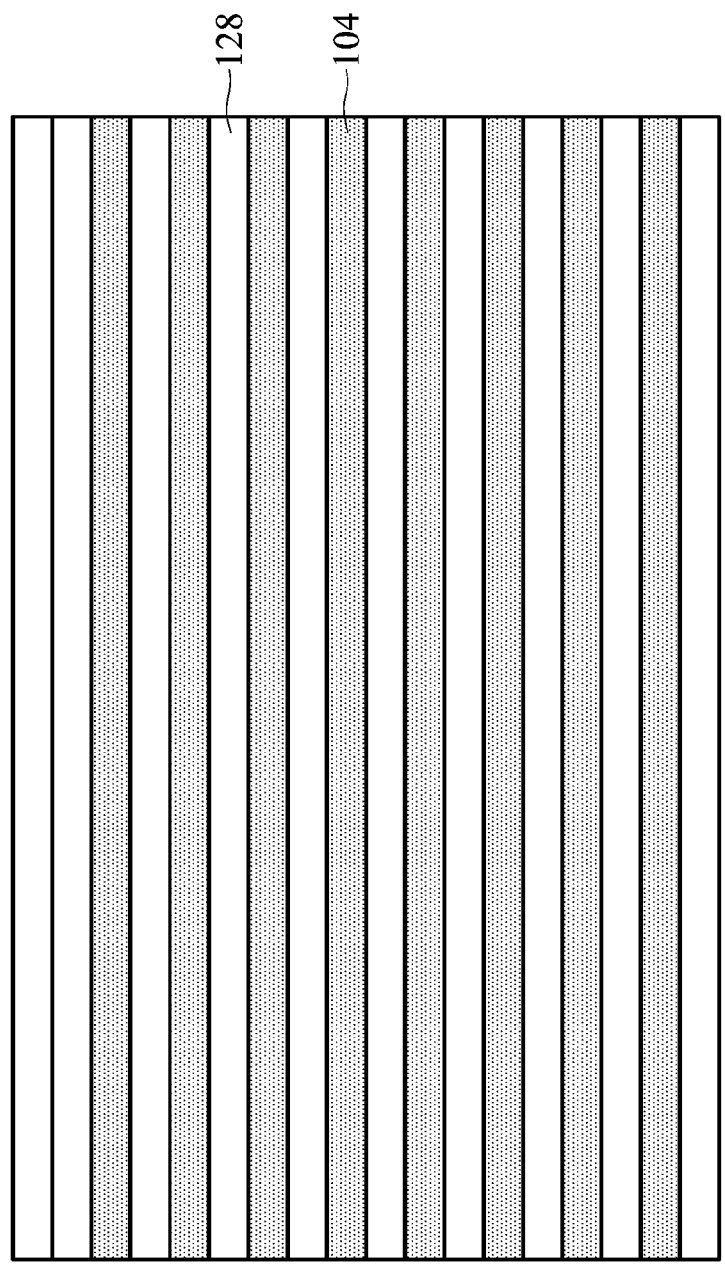
Figure 3B:
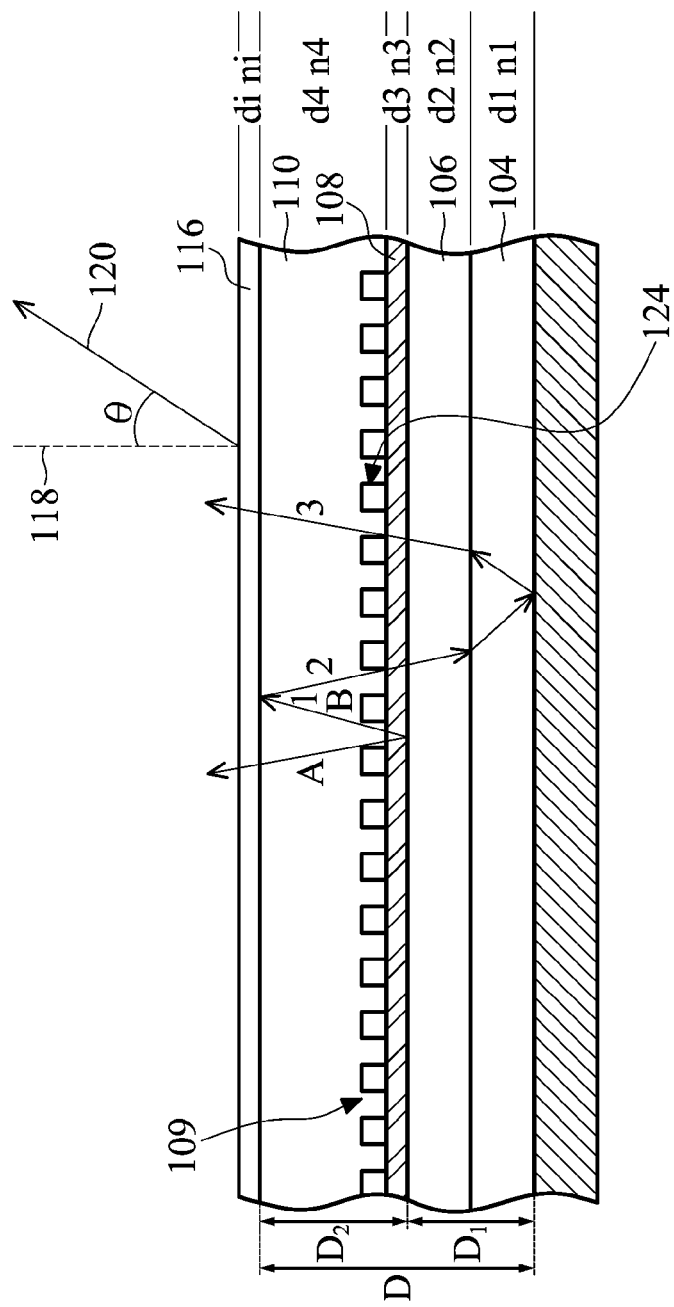

FIG. 2B and FIG. 3B are cross section views of the light emitting device 100 (FIG. 1A) or the light emitting device 100b (FIG. 1B). As shown in FIG. 2B, the distance between the light emitting layer 108 and the reflective layer 102, i.e., the thickness of the first carrier conductive layer 106 and the conductive layer 104 is depicted as thickness D1. The distance between the light polarizing layer 116 and the light emitting layer 108, i.e., the thickness of the second carrier conductive layer 110 and the light emitting layer 108 is depicted as thickness D2. The distance between the light polarizing layer 116 and the reflective layer 102, i.e., the thickness of the second carrier conductive layer 110, the light emitting layer 108, the first carrier conductive layer 106, and the conductive layer 104 is depicted as total thickness D.

In one embodiment, the thickness D2 (micrometers) of the second carrier conductive layer 110 and the light emitting layer 108 can be greater than or equal to 0.164 times of the mean value of refractive indices of the light polarizing layer 116 (FIG. 1a) or 116b (FIG. 1B), the second carrier conductive layer 110 and the light emitting layer 108 in FIG. 1A or FIG. 1B (i.e., $0.164 \times n_1$ μm, where $n_1$ is the mean value of refractive indices of the light polarizing layer, the carrier conductive layer and the light emitting layer). However, the total thickness D from the second carrier conductive layer 110 to the conductive layer 104 can be less than or equal to 0.82 times of the mean value of refractive indices of the polarized layer 116 (FIG. 1a) or 116b (FIG. 1B), the second carrier conductive layer 110, the light emitting layer 108, the first carrier conductive layer 106, and the conductive layer 104 in FIG. 1A or FIG. 1B (i.e., $0.82 \times n$ μm, where n is the mean value of refractive indices of the light polarizing layer, the carrier conductive layer, the light emitting layer, the carrier conductive layer, and the conductive layer). In a specific embodiment, for example a gallium nitride based light emitting diode with an emitted wavelength of 475 nm, the value of $n_1$ can be about 2.45, and D2 can be equal to or less than 0.4 μm. In the same embodiment, the value of $n_1$ can be about 2.45, and D can be equal to or less than 4.5 μm.

Further as shown in FIG. 2B and FIG. 3B, when the light emitting layer 108 emits lights, the emitted light isowards the surface layer plane, indicated as arrows A and B in FIGS. 1C and 1D, and towards the reflective layer 102. Since the surface layer plane of the light emitting device is designed with a light polarizing layer in the second embodiment of the invention such that part of the emitted light is directly transmitted through such as arrow A, part of the emitted light is refracted such as arrow B, and the light emitted from the light emitting layer 108 is polarized. The light refracted by the light polarizing layer 116 passes through the first carrier conductive layer 106 and the conductive layer 104 to the reflective layer 102, and then reflects by the reflective layer 102 and passes through the conductive layer 104, the first carrier conductive layer 106, the light emitting layer 108, the second carrier conductive layer 110 to the light polarizing layer 116 (as indicated in arrows 1-3 in FIGS. 2B and 3B). The emitted lights are cycling forwards and backwards between the light polarizing layer 116 and the reflective layer 102 until the directions of the emitted light is are toward a specific direction thereby passing through the polarized layer 116.

The patterns of the opening on the surface of the conductive layer 104 are composed of a photonic lattice which can enhance collimation of the emitted lights from the light emitting layer 108 and can further transform the cycling lights forwards and backwards between the polarized layer 116 and the reflective layer 102 into a polarized state. For example, referring to FIG. 3B, the reflected lights from the polarized layer 116 pass through the surface of the photonic lattice and transformed into a polarized state which can directly pass through the polarized layer 116. The openings of the photonic lattice formed on the surface of the conductive layer 104 not only can enhance light collimation effects, but also the emitted polarized light efficiency.

Figure 2E:
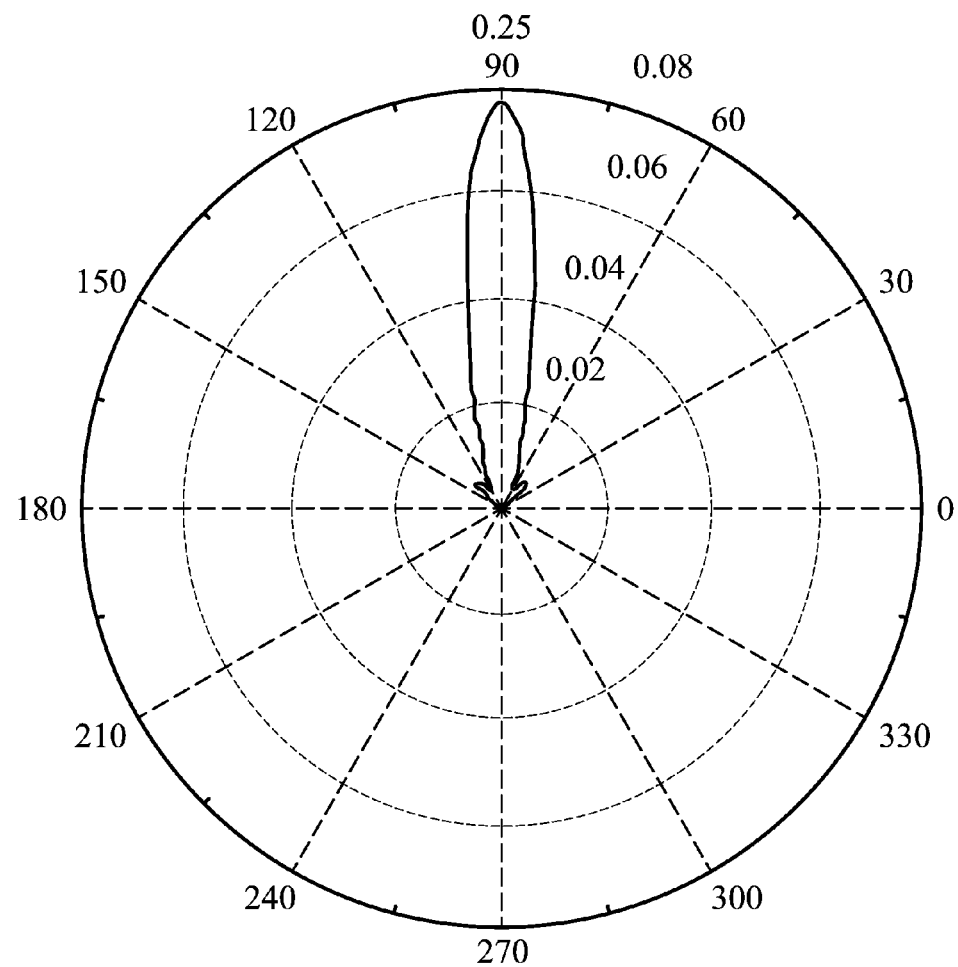
FIGS. 2E and 2F respectively show simulated diagrams of luminance and P/S ratio of the light emitting device according to the second embodiment of the invention.

Referring to FIGS. 2B and 3B, since the emitted lights from the light emitting layer 108 is preferably collimated, an included angle θ (a light emission angle) between the light vector 120 of the light emitting device and the normal line 118 perpendicular to the light emission plane is mostly equal to or less than 15 degrees (as indicated between 90-75 degrees in FIG. 2E). The normal line 118 is perpendicular to the surface layer plane.

Figure 3C:
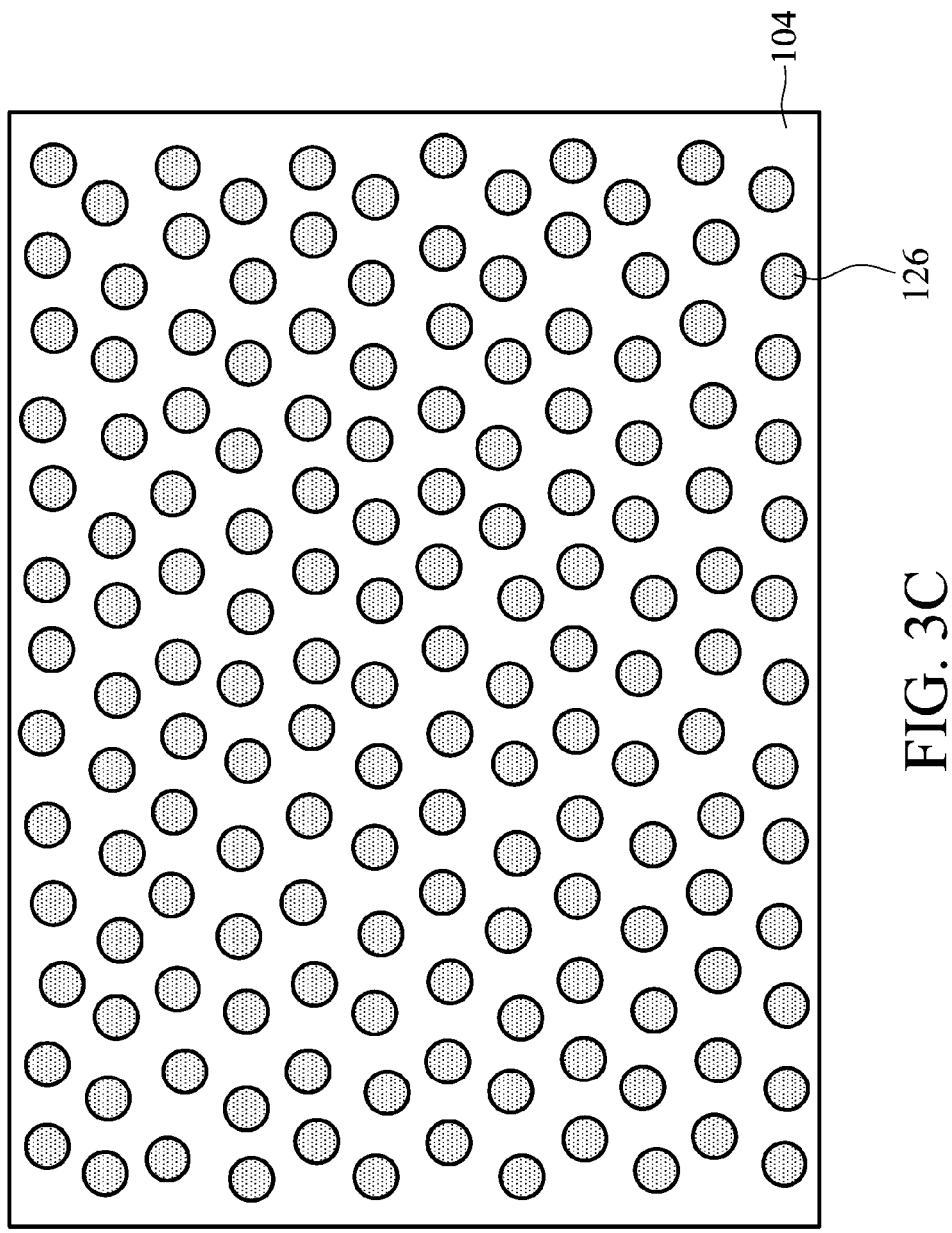

FIGS. 2C, 3C, 2D and 3D are schematic diagrams illustrating openings 124 on the surface of the conductive layer 104 in the light emitting device according to the second embodiment of the invention. As shown in FIG. 3C, the openings 124 can be pores 126 entirely or locally formed on the surface of the conductive layer 104. The pores 126 can be arranged with a specific interval therebetween or can be randomly arranged. Furthermore, the pores 126 can also be arranged in sub-pattern forms with several pores aggregated together and each sub-pattern are spaced with a specific interval therebetween. For example, the opening pattern composed of the pores 126 can be periodic or non-periodic.

The periodic pattern includes a honeycomb, a non-equilateral parallelogram, an equilateral parallelogram, an annular, a 1D grating, a quasi photonic crystal, or any combinations thereof.

Figure 2G:
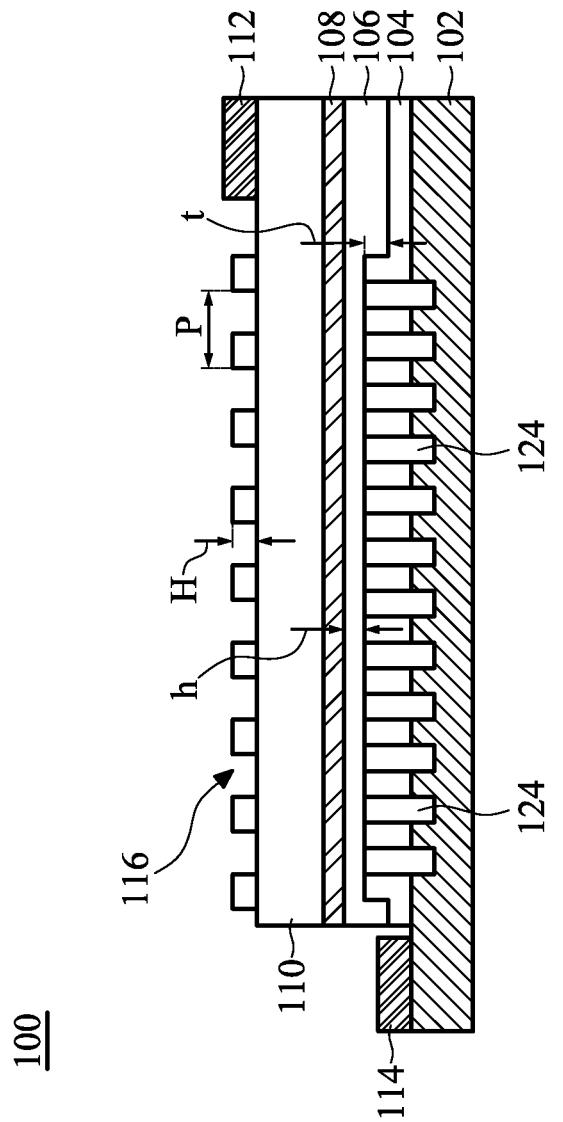
FIG. 2G is a cross section view of a light emitting device of another embodiment of the invention.
Figure 3D:
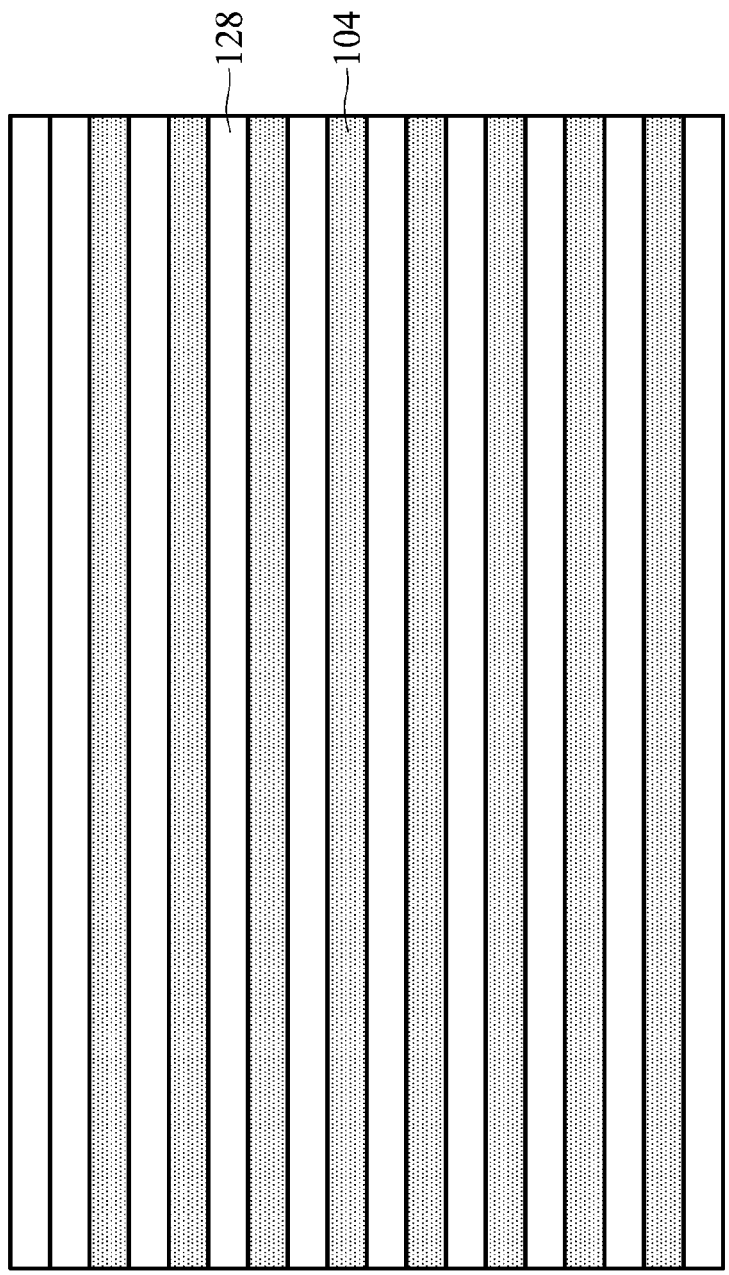

Referring to FIG. 3D, the openings 124 on the surface of the conductive layer 104 can alternatively be grooves 128 which can be periodically or non-periodically arranged. By doing so, lights passed through the surface of the conductive layer are transformed into the polarized state. In one embodiment, the openings 124 on the surface of the conductive layer 104 can be formed before formation of the first carrier conductive layer 106. For example, the openings 124 can be formed by anano-imprint lithography and etching processes to create pores 126 or grooves 128. In addition, the depth of the pores 126 or grooves 128 can reach with the conductive layer 104, or on the interface between the conductive layer 104 and reflective layer 102, or as shown in FIG. 2G, the openings 124 can even extend into the reflective layer 102.

Figure 2F:
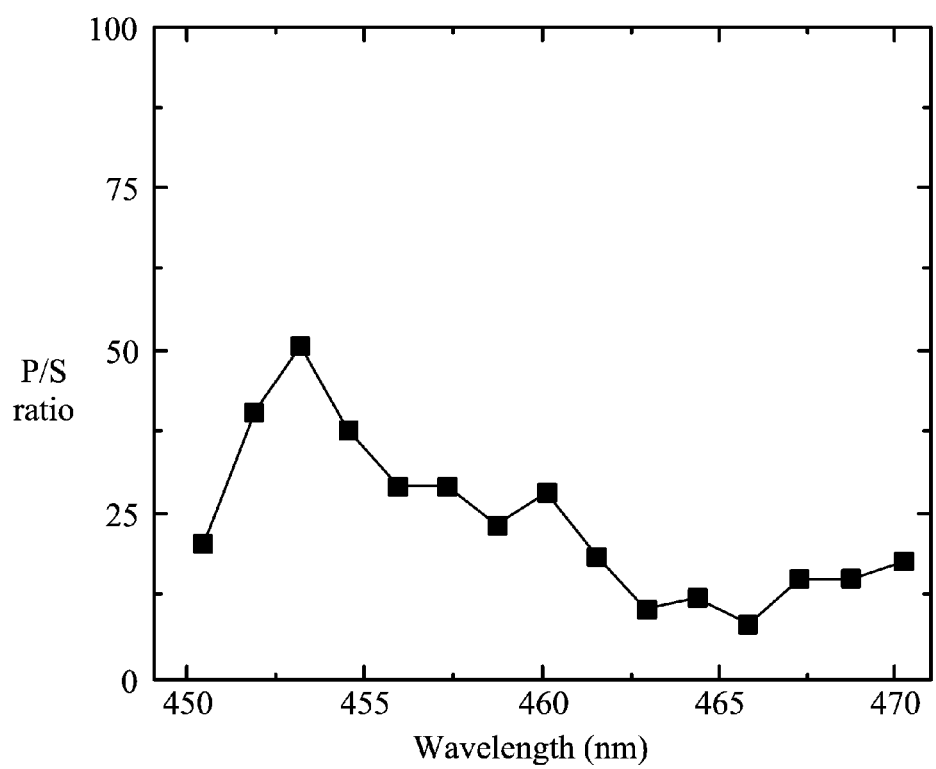

FIGS. 2E-2F respectively show simulated diagrams of luminance and P/S ratio of the light emitting device according to the second embodiment of the invention. Since the emission lights from the light emitting layer 108 of the second embodiment has preferable collimated effects, an included angle θ (a light emission angle) between the light vector 120 of light emitting device and the normal line 118 perpendicular to the surface layer plane is mostly equal to or less than 15 degrees (as indicated between 90-75 degrees in FIG. 2E).

According to the first and the second embodiments of the light emitting devices, the collimated and polymerized elements are fabricated in a conventional LED structure 100 as shown in FIG. 1A. Alternatively, the collimated and polymerized elements can also be fabricated in a thinned LED structure 100b in FIG. 1B. The first and the second carrier conductive layers 106 and 110 can correspond to a p-type and an n-type carrier conductive layers, but switching thereof can also be applicable. The bottom conductive electrode 114 can be not necessarily made up of Cu.

In summary, according to the light emitting devices of embodiments of the invention, the light emitting layer emits lights with specific wavelengths. The lights with specific wavelengths have a peak wavelength λ and a bandwidth Δλ. The light emitting layer can be disposed away from the reflective layer with a quarter of the emitted wavelength or m an integral times of a quarter of the emitted wavelength. A light polarizing layer can be disposed on the light emission plane of the light emitting device such that the light emitting device can emit both collimated and polarized light. Moreover, a photonic lattice of opening patterns can be optionally formed on an interface between any two adjacent deposition layers such as between the carrier conductive layer and the conductive layer. The photonic lattice of opening patterns can transform polarity of lights inside the light emitting devices and can further enhance collimation effects and P/S ratio of the emitted light from the light emitting devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A light emitting device, at least comprising:
   a polarizing surface layer;
   a light emitting layer which emits light at a wavelength;
   a reflective layer, wherein the light emitting layer is disposed between the reflective layer and the polarizing surface layer, and an optical thickness between the light emitting layer and the reflective layer is less than a value of five times of a quarter of the wavelength; and
   a light transformation layer disposed between the light emitting layer and the reflective layer, wherein the light transformation layer comprises pores or grooves extending into the reflective layer.

2. The light emitting device as claimed in claim 1, wherein the optical thickness between the light emitting layer and the reflective layer is about a value between integer m−1 and m+1 times of a quarter of the wavelength.

3. The light emitting device as claimed in claim 1, wherein the optical thickness between the light emitting layer and the reflective layer is about a value of m times of a quarter of the wavelength, where m is a positive integer, and is satisfied $1 \leq m \leq 12$.

4. The light emitting device as claimed in claim 1, wherein the structure of the light emitting layer is a quantum well structure or a quantum dot structure.

5. The light emitting device as claimed in claim 1, wherein a material of the light emitting layer includes a fluorescent inorganic material, a phosphorescent inorganic material, a fluorescent organic material, or a phosphorescent organic material.

6. The light emitting device as claimed in claim 1, wherein the reflective layer at least comprises a metallic layer.

7. The light emitting device as claimed in claim 1, wherein the polarizing surface layer is a metal layer, a periodic parallel stripe interval arranged metal layer, a plurality of dielectric stack of light polarizing thin films or an organic light polarizing layer.

8. The light emitting device as claimed in claim 1, wherein the optical thickness between the polarizing surface layer and the reflective layer is about equal to or less than 20 times of the wavelength, but greater than or equal to a half of the wavelength.

9. The light emitting device as claimed in claim 1, further comprising a conductive layer interposed between the light emitting layer and the reflective layer.

10. The light emitting device as claimed in claim 1, wherein a material of the light transformation layer at least comprises a transparent conductive material or a carrier conductive layer.

11. The light emitting device as claimed in claim 1, wherein a material of the light emitting layer comprises a III-V group semiconductor material.

12. The light emitting device as claimed in claim 11, wherein the III-V group semiconductor material is a nitrided base material, an eptiaxial GaAs or InP base grown material.

13. The light emitting device as claimed in claim 1, wherein the light transformation layer is an interface layer with a plurality of structures, the structures is distributed on an interface of the transformation in patterned forms, and a dielectric function of the interface is a spatial function of pattern variations such that the emitted light of the light emitting device is collimated.

14. The light emitting device as claimed in claim 13, wherein the plurality of structures at least comprise an opening, a pillar, a pore, or a stripe grating.

15. The light emitting device as claimed in claim 13, wherein the plurality of structures have a periodic or a non-periodic pattern.

16. The light emitting device as claimed in claim 15, wherein the periodic pattern is a honeycomb, a non-equilateral parallelogram, an equilateral parallelogram, an annular, a 1D grating or a quasi photonic crystal.

* * * * *